US010625622B2

(12) United States Patent
Bando

(10) Patent No.: US 10,625,622 B2
(45) Date of Patent: Apr. 21, 2020

(54) POWER SUPPLY DEVICE OF VEHICLE

(71) Applicant: Honda Motor Co., Ltd., Tokyo (JP)

(72) Inventor: Masashi Bando, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 33 days.

(21) Appl. No.: 15/995,137

(22) Filed: Jun. 1, 2018

(65) Prior Publication Data
US 2018/0361861 A1  Dec. 20, 2018

(30) Foreign Application Priority Data
Jun. 14, 2017  (JP) .................................. 2017-117012

(51) Int. Cl.
B60L 53/14 (2019.01)
G01R 31/392 (2019.01)
(Continued)

(52) U.S. Cl.
CPC .................. B60L 53/14 (2019.02); B60L 1/00 (2013.01); B60L 58/13 (2019.02); B60L 58/20 (2019.02); G01R 31/392 (2019.01)

(58) Field of Classification Search
CPC .......... B60L 53/14; B60L 58/20; B60L 58/13; B60L 1/00; G01R 31/392; H02J 7/0077;
(Continued)

(56) References Cited

U.S. PATENT DOCUMENTS 5,633,577 A * 5/1997 Matsumae ............ H02J 7/0013
322/37
7,742,885 B2 * 6/2010 Oohasi .................. B60L 3/0038
702/63
(Continued)

FOREIGN PATENT DOCUMENTS

JP  2009118659  5/2009
JP  2013-085394  5/2013
(Continued)

OTHER PUBLICATIONS

"Office Action of Japan Counterpart Application", dated Jan. 8, 2019, with English translation thereof, p. 1-p. 6.
(Continued)

Primary Examiner — M Baye Diao
(74) Attorney, Agent, or Firm — JCIPRNET

(57) ABSTRACT

A power supply device of a vehicle which allows capability of a charger to be sufficiently exhibited at the time of quick charging without increasing an operable voltage of an auxiliary device or the like is provided. The power supply device of a vehicle includes a first circuit in which a first capacitor is provided, a second circuit in which a second capacitor having a full charge voltage higher than that of the first capacitor is provided, a voltage converter provided between the first circuit and the second circuit, and an external terminal provided between the first capacitor and the voltage converter in the first circuit and to which an external charger is connected, in which a vehicle auxiliary device is connected to the first circuit, and a negative contactor electrically opening and closing between the vehicle auxiliary device and the external terminal is further provided.

9 Claims, 4 Drawing Sheets

(51) Int. Cl.
   *B60L 58/13* (2019.01)
   *B60L 1/00* (2006.01)
   *B60L 58/20* (2019.01)

(58) Field of Classification Search
   CPC ...... H02J 7/0073; H02J 7/0068; H02J 7/0031; H01M 10/44
   USPC .......................... 320/132, 104; 307/9.1, 10.1
   See application file for complete search history.

(56) References Cited

U.S. PATENT DOCUMENTS

| | | | | |
|---|---|---|---|---|
| 7,835,831 | B2 * | 11/2010 | Chung | B60L 58/34 |
| | | | | 701/22 |
| 8,188,616 | B2 * | 5/2012 | Nordstrom | B60R 16/03 |
| | | | | 307/10.1 |
| 9,279,860 | B2 * | 3/2016 | Sekiguchi | G01R 31/3644 |
| 9,627,979 | B2 * | 4/2017 | Safaee | H02M 3/33507 |
| 10,340,810 | B2 * | 7/2019 | Achtzehn | H02M 3/33584 |
| 2006/0097577 | A1 * | 5/2006 | Kato | F02N 11/0866 |
| | | | | 307/10.1 |
| 2012/0091930 | A1 * | 4/2012 | Takahashi | H02J 7/0013 |
| | | | | 318/139 |
| 2013/0266826 | A1 * | 10/2013 | Cowperthwaite | H01G 9/28 |
| | | | | 429/7 |
| 2015/0358452 | A1 * | 12/2015 | Kranz | A61B 5/04087 |
| | | | | 455/557 |
| 2016/0090001 | A1 * | 3/2016 | Nomoto | B60L 1/003 |
| | | | | 320/109 |

FOREIGN PATENT DOCUMENTS

| | | |
|---|---|---|
| JP | 2014230468 | 12/2014 |
| JP | 2015-159625 | 9/2015 |
| JP | 2015201995 | 11/2015 |

OTHER PUBLICATIONS

"Office Action of Japan Counterpart Application," dated Sep. 11, 2018, with English translation thereof, p. 1-p. 8.

* cited by examiner

POWER SUPPLY DEVICE OF VEHICLE

CROSS-REFERENCE TO RELATED APPLICATION

This application claims the priority of Japan patent application serial no. 2017-117012, filed on Jun. 14, 2017. The entirety of the above-mentioned patent application is hereby incorporated by reference herein and made a part of this specification.

BACKGROUND

Technical Field

The disclosure relates to a power supply device of a vehicle.

Description of Related Art

Electric vehicles such as hybrid automobiles and electric automobiles travel by driving a motor using electric power supplied from a battery. Also, batteries installed in electric vehicles can be charged with electric power supplied from chargers outside the vehicle such as normal charging facilities or quick charging facilities.

Patent Document 1 discloses a power supply device of a vehicle including a charger for charging a plurality of batteries from the outside. This charger has a plurality of charging output systems and distributes charging power according to a charge ratio (a ratio of a remaining capacity of the battery to a fully charged capacity in percentage, hereinafter referred to as "state of charge (SOC)") of each corresponding battery. It is said that SOC can be aligned among a plurality of batteries.

PATENT DOCUMENTS

[Patent Document 1] Japanese Laid-open No. No 2009-118659

In a power supply device of a vehicle disclosed in Patent Document 1, although the charger has a plurality of charging output systems, power supply targets are devices having substantially the same withstand voltage, and it is impossible to protect a device with a relatively low operable voltage at the time of quick charging. When a simple solution of uniformly increasing operable voltages of auxiliary devices and the like is adopted, the overall cost of the vehicle will inevitably increase. Also, when operable voltages of auxiliary devices and the like are increased, there is a possibility of loss in the auxiliary devices and the like growing higher accordingly.

SUMMARY

The disclosure is to provide a power supply device of a vehicle which allows capability of a charger to be sufficiently exhibited at the time of quick charging without increasing an operable voltage of auxiliary devices and the like.

A power supply device (for example, a power supply device 1 or 1*a* of a vehicle to be described below) of a vehicle (for example, vehicles V or Va to be described below) includes a first circuit (for example, a low-voltage circuit 20 or 20*a* to be described below) in which a first capacitor (for example, a low-voltage battery BL to be described below) is provided, a second circuit (for example, a high-voltage circuit 10 to be described below) in which a second capacitor (for example, a high-voltage battery BH to be described below) having a full charge voltage higher than that of the first capacitor is provided, a voltage converter (for example, a VCU 30 to be described below) provided between the first circuit and the second circuit, and an external connecting portion (for example, a low-voltage external terminal 27 to be described below) provided between the first capacitor and the voltage converter in the first circuit and to which an external charger (for example, a low-voltage external charger CL to be described below) is connected, in which a vehicle auxiliary device is connected to the first circuit, and a switch (for example, a negative contactor 2 or a positive contactor 3*a* to be described below) electrically opening and closing between the vehicle auxiliary device and the external connecting portion is further provided.

DESCRIPTION OF THE EMBODIMENTS

First Embodiment

Figure 1:
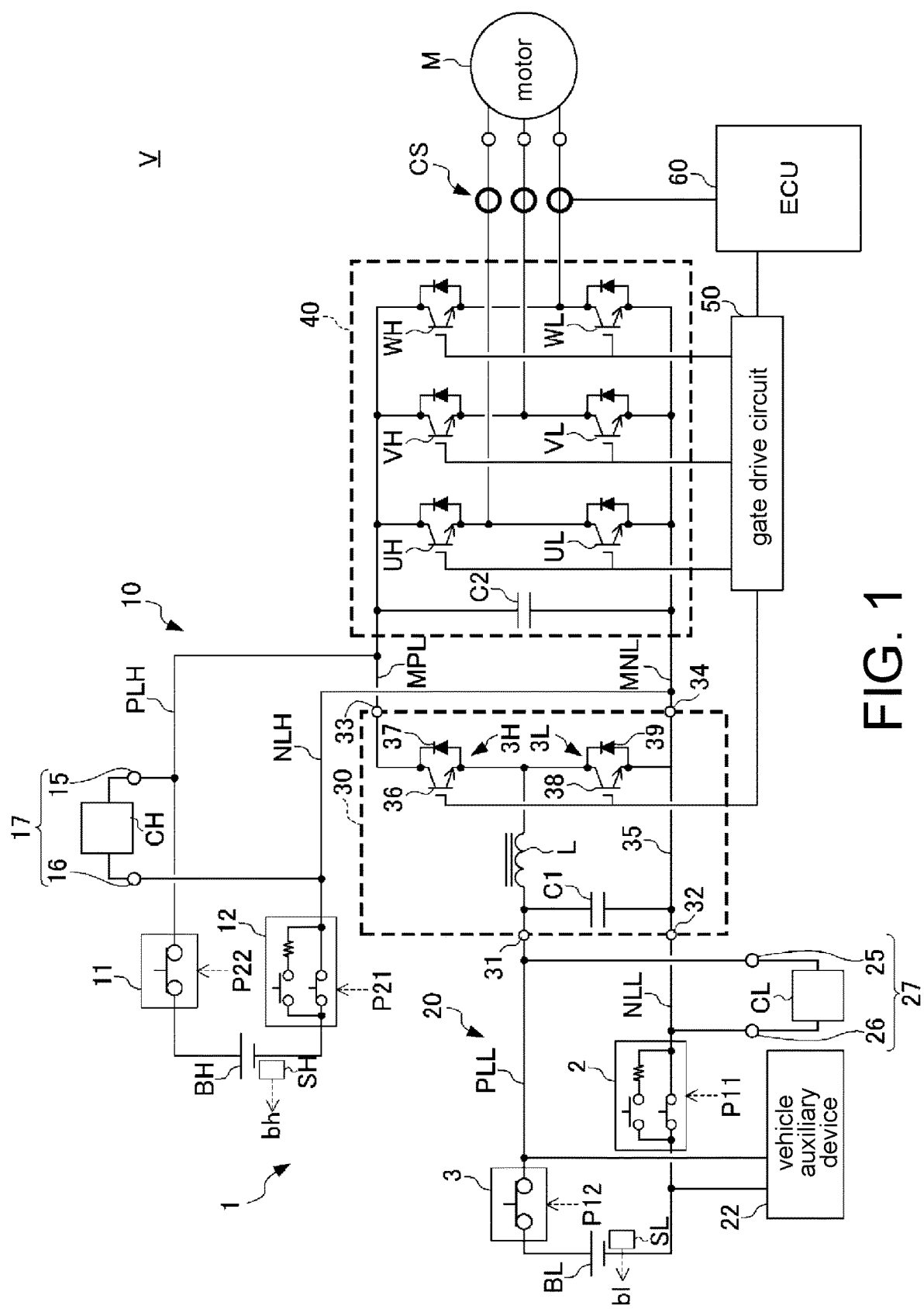
FIG. 1 is a diagram illustrating a configuration of an electric vehicle on which a power supply device according to a first embodiment of the disclosure is mounted and two types of external chargers.

Hereinafter, a first embodiment of the disclosure will be described with reference to the drawings. FIG. 1 is a diagram illustrating a configuration of an electric vehicle V (hereinafter simply referred to as a "vehicle") on which a power supply device 1 according to the present embodiment is mounted and two types of external chargers CH and CL for the vehicle V.

A high-voltage external charger CH and a low-voltage external charger CL serving as the external chargers are quick chargers installed in a charging station, a commercial facility, a public facility, and the like, which are facilities primarily for the purpose of charging. These external chargers CH and CL each output a direct current (DC) of a predetermined charging voltage to the power supply device 1 of the vehicle V via a charging cable. An output voltage of the high-voltage external charger CH is higher than a charging voltage of the low-voltage external charger CL. Hereinafter, for example, a case in which a charging voltage of the high-voltage external charger CH is 1000 [V] and a charging voltage of the low-voltage external charger CL is 500 [V] will be described, but the disclosure is not limited thereto.

When a charging connector provided at a tip of its charging cable is connected to an inlet (not illustrated) of the vehicle V, the positive and negative terminals of the high-voltage external charger CH are connected to a high-voltage external positive terminal 15 and a high-voltage external negative terminal 16, to be described below, provided in the power supply device 1. Also, when a charging connector provided at a tip of the charging cable is connected to an inlet (not illustrated) of the vehicle V, the positive and negative terminals of the low-voltage external charger CL are connected to a low-voltage external positive terminal 25 and a low-voltage external negative terminal 26, to be described below, provided in the power supply device 1.

When the external charger CH (CL) is connected to both terminals 15 and 16 (25 and 26) of the power supply device 1, power can be supplied from the external charger CH (CL) to the power supply device 1, and it is possible to perform power line communication (PLC) which is communication via a power line between the external charger CH (CL) and an electronic control unit (ECU) 60 (to be described below) of the power supply device 1. The external chargers CH and CL operate under control of the ECU 60 in response to a charger control signal received from the ECU 60 via the PLC communication.

In FIG. 1, a state in which two external chargers CH and CL are both connected to the vehicle V is illustrated for convenience of description, however these two external chargers CH and CL cannot be connected to one vehicle V at the same time, and only one of them can be selectively connected. In other words, when the high-voltage external charger CH is connected to the vehicle V, the low-voltage external charger CL cannot be connected to the same vehicle V, and when the low-voltage external charger CL is connected to the vehicle V, the high-voltage external charger CH cannot be connected to the same vehicle V.

The vehicle V includes a traveling motor M mechanically connected to its drive wheels (not illustrated) and the power supply device 1 for supplying power to the traveling motor M. The traveling motor M may be, for example, a three-phase alternating current (AC) motor.

The power supply device 1 includes a high-voltage circuit 10 in which a high-voltage battery BH is provided as a second capacitor, a low-voltage circuit 20 in which a low-voltage battery BL is provided as a first capacitor, a voltage converter 30 (hereinafter the abbreviation "VCU (Voltage Control Unit)" 30 will be used), an inverter 40, a main positive line MPL and a main negative line MNL connecting the VCU 30 to the inverter 40, a gate drive circuit 50 for driving a plurality of switching elements provided in the VCU 30 and the inverter 40, a current sensor CS, and the ECU 60 which is an electronic control module for controlling these.

The high-voltage circuit 10 includes a positive line PLH which connects a positive electrode of the high-voltage battery BH and the main positive line MPL, a negative line NLH which connects a negative electrode of the high-voltage battery BH and the main negative line MNL, a positive contactor 11 provided on the positive line PLH, a negative contactor 12 provided on the negative line NLH, the high-voltage external positive terminal 15 provided on the main positive line MPL side with respect to the positive contactor 11 in the positive line PLH, and the high-voltage external negative terminal 16 provided on the main negative line MNL side with respect to the negative contactor 12 in the negative line NLH.

The high-voltage battery BH is a secondary battery capable of both discharging in which chemical energy is converted into electric energy and charging in which electric energy is converted into chemical energy. In the following description, as the high-voltage battery BH, a so-called lithium-ion battery which performs charging and discharging by moving lithium ions between electrodes will be described, but the disclosure is not limited thereto.

In the following description, as the high-voltage battery BH, a case in which a voltage at full charge is higher than an output voltage of the low-voltage external charger CL and lower than the output voltage of the high-voltage external charger CH will be described. More specifically, a voltage of the fully charged high-voltage battery BH is, for example, 800 [V], but the disclosure is not limited thereto.

In addition, a sensor unit SH is provided in the high-voltage battery BH. The sensor unit SH is constituted by a plurality of sensors which detect physical quantities necessary for acquiring a state of charge (SOC) of the high-voltage battery BH and transmit a detection signal bh corresponding to the detected value to the ECU 60. More specifically, the sensor unit SH is constituted by a voltage sensor which detects a voltage of the high-voltage battery BH, a current sensor which detects a current of the high-voltage battery BH, a temperature sensor which detects a temperature of the high-voltage battery BH, and the like. The SOC of the high-voltage battery BH during execution of external charging or while traveling is, for example, sequentially calculated by the ECU 60 on the basis of a known algorithm using the detection signal bh from the sensor unit SH.

The contactors 11 and 12 are of a normally open type in which the contactors 11 and 12 are opened to disconnect the high-voltage battery BH from the terminals 15 and 16 and the lines MPL and MNL in a state in which no command signal from the outside is input and are closed to connect the high-voltage battery BH to the terminals 15 and 16 and the lines MPL and MNL in a state in which a command signal is input. The contactor 11 opens and closes according to a control signal P21 transmitted from the ECU 60, and the contactor 12 opens and closes according to a control signal P22 transmitted from the ECU 60. Further, the negative contactor 12 is a pre-charge contactor having a pre-charge resistance for alleviating a rush current to a capacitor.

The high-voltage external positive terminal 15 and the high-voltage external negative terminal 16 are respectively connected to the positive output terminal and the negative output terminal of the high-voltage external charger CH. Hereinafter, these two terminals 15 and 16 are collectively referred to as a high-voltage external terminal 17.

The low-voltage circuit 20 includes a positive line PLL which connects a positive electrode of the low-voltage battery BL and a low-voltage side positive terminal 31 of the VCU 30, a negative line NLL which connects a negative electrode of the low-voltage battery BL and a low-voltage side negative terminal 32 of the VCU 30, a positive contactor 3 provided on the positive line PLL, a negative contactor 2 provided on the negative line NLL, a vehicle auxiliary device 22 connected to the positive line PLL and the negative line NLL, the low-voltage external positive terminal 25 provided on the low-voltage side positive terminal 31 side of the VCU 30 with respect to a connection point of the positive contactor 3 and the vehicle auxiliary device 22 in the positive line PLL, and the low-voltage external negative terminal 26 provided on the low-voltage side negative terminal 32 side of the VCU 30 with respect to a connection point of the negative contactor 2 and the vehicle auxiliary device 22 in the negative line NLL.

The vehicle auxiliary device 22 is constituted by a plurality of auxiliary devices including a battery heater, an air conditioner inverter, a DC-DC converter, and the like, an auxiliary device battery (for example, a lead battery) which is a power supply for driving these auxiliary devices, and the like. The vehicle auxiliary device 22 has an operable voltage. Here, the operable voltage is a highest voltage within a voltage range in which its operation can be performed according to a specification thereof. This operable voltage is lower than a withstand voltage (dielectric strength), which is an upper limit of a voltage that can be applied to insulation of a device without causing dielectric breakdown. In the vehicle auxiliary device 22 of the present embodiment, the operable voltage is equal to or less than a charging voltage of the low-voltage external charger CL, and is higher than a first switching voltage b [V], to be described below, which is a threshold value determined with respect to a voltage of the low-voltage battery BL.

The low-voltage external positive terminal 25 and the low-voltage external negative terminal 26 are respectively connected to a positive output terminal and a negative output terminal of the low-voltage external charger CL. Hereinafter, these two terminals 25 and 26 are collectively referred to as a low-voltage external terminal 27.

The low-voltage battery BL is a secondary battery capable of both discharging in which chemical energy is converted into electric energy and charging in which electric energy is converted into chemical energy. In the following description, a so-called lithium-ion battery which performs charging and discharging by moving lithium ions between electrodes is used as the low-voltage battery BL will be described, but the disclosure is not limited thereto.

In the following description, as the low-voltage battery BL, a case in which its voltage at full charge is lower than the output voltage of the low-voltage external charger CL will be described. More specifically, a voltage of the fully charged low-voltage battery BL is, for example, 400 [V], but the disclosure is not limited thereto.

In addition to the voltages at full charge, the high-voltage battery BH and the low-voltage battery BL have the following differences. The high-voltage battery BH has a lower output weight density than the low-voltage battery BL but has a higher energy weight density. That is, the high-voltage battery BH is superior to the low-voltage battery BL in terms of an energy weight density, and the low-voltage battery BL is superior to the high-voltage battery BH in terms of an output weight density. The energy weight density is an amount of electric power per unit weight [Wh/kg], and the output weight density is electric power per unit weight [W/kg]. Therefore, the high-voltage battery BH excellent in energy weight density is a capacitor primarily for the purpose of high capacity, and the low-voltage battery BL excellent in output weight density is a capacitor primarily for the purpose of high output.

In addition, a sensor unit SL is provided in the low-voltage battery BL. The sensor unit SL is constituted by a plurality of sensors which detect physical quantities necessary for acquiring an SOC of the low-voltage battery BL and transmit a detection signal b1 corresponding to the detected value to the ECU 60. More specifically, the sensor unit SL is constituted by a voltage sensor which detects a voltage of the low-voltage battery BL, a current sensor which detects a current of the low-voltage battery BL, a temperature sensor which detects temperature of the low-voltage battery BL, and the like. The SOC of the low-voltage battery BL during execution of external charging or while traveling is, for example, sequentially calculated by the ECU 60 on the basis of the known algorithm using the detection signal b1 from the sensor unit SL.

The positive contactor 3 is provided on the low-voltage battery BL side with respect to a connection point of the vehicle auxiliary device 22 in the positive line PLL. The negative contactor 2 is provided on the external negative terminal 26 side with respect to a connection point of the vehicle auxiliary device 22 in the negative line NLL. Therefore, in a state in which the low-voltage external charger CL is connected to the low-voltage external terminal 27, when the negative contactor 2 is closed, the low-voltage external charger CL and the vehicle auxiliary device 22 are conducted, and when the negative contactor 2 is open, the conduction between the low-voltage external charger CL and the vehicle auxiliary device 22 is cut off. Also, when the positive contactor 3 is closed, the low-voltage battery BL and the vehicle auxiliary device 22 are conducted, and when the positive contactor 3 is open, the conduction between the low-voltage battery BL and the vehicle auxiliary device 22 is cut off.

The contactors 2 and 3 are of a normally open type which is open in a state in which no command signal from the outside is input, and is closed in a state in which a command signal is input. The contactor 2 opens and closes according to a control signal P11 transmitted from the ECU 60, and the contactor 3 opens and closes according to a control signal P12 transmitted from the ECU 60. Further, the negative contactor 2 is a pre-charge contactor having a pre-charge resistance for alleviating a rush current to a capacitor.

The VCU 30 is provided between the high-voltage circuit 10 and the low-voltage circuit 20. As described above, the low-voltage side positive terminal 31 and the low-voltage side negative terminal 32 of the VCU 30 are respectively connected to the positive line PLL and the negative line NLL of the low-voltage circuit 20. A high-voltage side positive terminal 33 and a high-voltage side negative terminal 34 of the VCU 30 are respectively connected to the positive line PLH and the negative line NLH of the high-voltage circuit 10 via the main positive line MPL and the main negative line MNL.

The VCU 30 is a bidirectional DC-DC converter configured by a combination of a reactor L, a smoothing capacitor C1, a high-arm element 3H, a low-arm element 3L, and a negative bus 35.

The negative bus 35 is a wiring which connects the low-voltage side negative terminal 32 and the high-voltage side negative terminal 34. One end side of the smoothing capacitor C1 is connected to the low-voltage side positive terminal 31 and the other end side thereof is connected to the negative bus 35. One end side of the reactor L is connected to the low-voltage side positive terminal 31, and the other end thereof is connected to a connection node between the high-arm element 3H and the low-a ii element 3L.

The high-arm element 3H includes a high-arm switching element 36 and a diode 37 connected in parallel to the high-arm switching element 36. The low-arm element 3L includes a low-arm switching element 38 and a diode 39 connected in parallel to the low-arm switching element 38. These switching elements 36 and 38 are connected in series between the high-voltage side positive terminal 33 and the negative bus 35. A collector of the high-arm switching element 36 is connected to the high-voltage side positive terminal 33. An emitter of the low-arm switching element 38 is connected to the negative bus 35. A forward direction of the diode 37 is a direction from the reactor L to the high-voltage side positive terminal 33. A forward direction of the diode 39 is a direction from the negative bus 35 to the reactor L. For these switching elements 36 and 38, a known power switching element such as an insulated gate bipolar transistor (IGBT), a metal oxide semiconductor field effect transistor (MOSFET), or the like is used.

The high-arm switching element 36 and the low-arm switching element 38 are respectively turned on or off by gate drive signals generated by the gate drive circuit 50 on the basis of control signals from the ECU 60.

According to the VCU 30 configured as described above, by driving the switching elements 36 and 38 to be turned on and off with the gate drive signal generated at a predetermined timing from the gate drive circuit 50, a voltage boost function and a voltage step-down function, to be described in detail below, are exhibited. The voltage boost function is a function of boosting a voltage applied between the terminals 31 and 32 on the low-voltage side and outputting the boosted voltage between the terminals 33 and 34 on the high-voltage side, and thereby a current flows from the low-voltage circuit 20 to the high-voltage circuit 10 and the inverter 40. In addition, the voltage step-down function is a function of stepping down a voltage applied between the terminals 33 and 34 on the high-voltage side and outputting the stepped down voltage between the terminals 31 and 32 on the low-voltage side, and thereby a current flows from the high-voltage circuit 10 and the inverter 40 to the low-voltage circuit 20.

The inverter 40 is, for example, a pulse width modulation (PWM) inverter using pulse width modulation in which a bridge circuit configured by bridge-connecting a plurality of switching elements (for example, IGBT) is included. One side of the inverter 40 is connected to the main positive line MPL and the main negative line MNL, and the other side is connected to each coil of U-phase, V-phase, and W-phase of the traveling motor M.

A bridge circuit configured by bridge-connecting a high-side U-phase switching element UH and a low-side U-phase switching element UL which are connected to the U phase of the traveling motor M, a high-side V-phase switching element VH and a low-side V-phase switching element VL which are connected to the V phase of the traveling motor M, and a high-side W-phase switching element WH and a low-side W-phase switching element WL which are connected to the W phase of the traveling motor M for each phase, and a smoothing capacitor C2 are included in the inverter 40. The current sensor CS detects a current of each phase of the traveling motor M and transmits signals corresponding to the detected value to the ECU 60.

When the vehicle is traveling, the ECU 60 generates a torque current command signal using the detection signal of the current sensor CS and inputs the torque current command signal to the gate drive circuit 50. The gate drive circuit 50 generates drive signals for the respective switching elements UH, UL, VH, VL, WH, and WL on the basis of the torque current command signal from the ECU 60, and drives the switching elements at a predetermined phase. As a result, a rotating magnetic field is generated in a stator coil of the traveling motor M, and an output shaft of the traveling motor M rotates.

Figure 2:
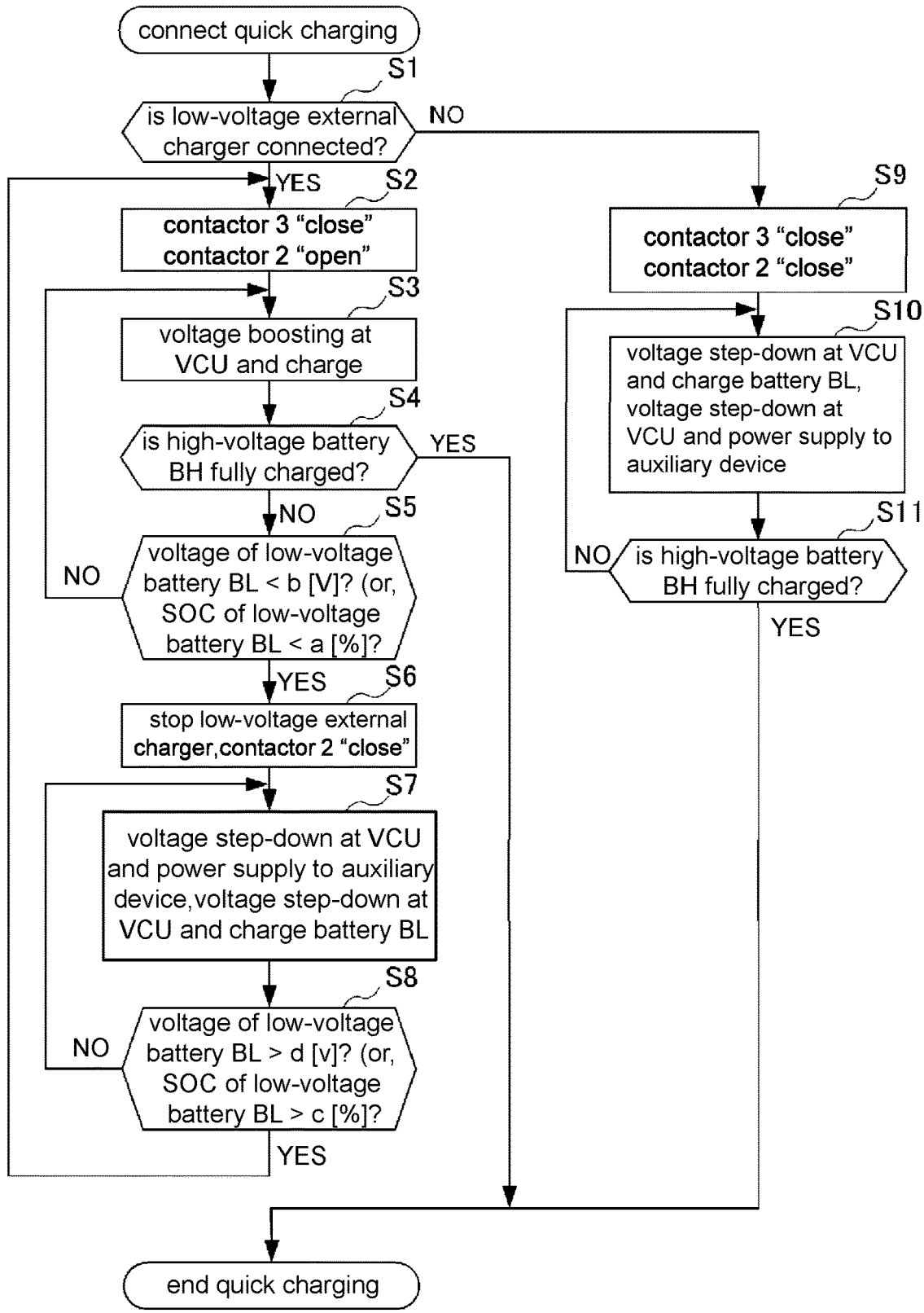
FIG. 2 is a flowchart showing a processing procedure executed by a control portion at the time of quick charging in the power supply device of the vehicle of FIG. 1.

FIG. 2 is a flowchart showing a processing procedure executed by a control portion at the time of quick charging in the power supply device of the vehicle of FIG. 1. Further, when a user of the vehicle performs an operation for quick charging, the contactor 12 and the contactor 11 are assumed to be closed.

First, in step S1, the ECU 60 determines whether or not a charger connected to the power supply device 1 of the vehicle is the low-voltage external charger CL. Specifically, it is determined whether the low-voltage external charger CL is connected to the low-voltage external terminal 27 or the high-voltage external charger CH is connected to the high-voltage external terminal 17. When the determination in step S1 is YES, that is, when it is determined that the low-voltage external charger CL is connected to the low-voltage external terminal 27, the flow proceeds to step S2, and when the determination is NO, that is, when it is determined that the high-voltage external charger CH is connected to the high-voltage external terminal 17, the flow proceeds to step S9.

In step S2, the ECU 60 executes processing of closing the contactor 3 by the control signal P12 and opening the contactor 2 by the control signal P11. A current path at the time of quick charging of the high-voltage battery BH is as follows when it is traced along a path on the positive electrode side. Low-voltage external charger CL→low-voltage external positive terminal 25 of low-voltage external terminal 27→positive line PLL of low-voltage circuit 20→VCU 30→positive line PLH of high-voltage circuit 10→contactor 11→positive electrode of high-voltage battery BH. When this path is established, as described above, since the contactor 2 is opened by the control signal P11, even when the low-voltage external charger CL operates with an output voltage of an upper limit of its capability, a voltage between the output terminals of the low-voltage external charger CL is not applied to the vehicle auxiliary device 22. After the processing of step S2, the ECU 60 proceeds to step S3.

In step S3, the ECU 60 causes the gate drive circuit 50 to supply a drive signal to the VCU 30. Thereby, the VCU 30 performs a voltage boosting operation, and the high-voltage battery BH is quickly charged from the low-voltage external charger CL via the above-described current path established in step S2.

Figure 3:
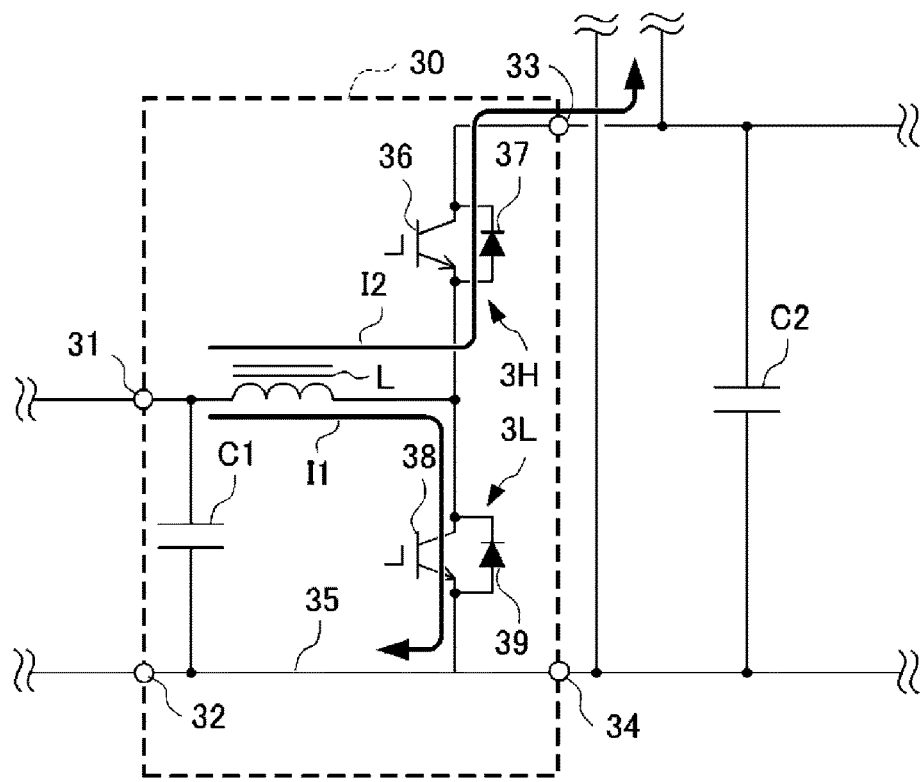
FIG. 3 is a circuit diagram for describing a flow of current at the time of a voltage boosting operation.

FIG. 3 is a circuit diagram for describing a flow of current at the time of a voltage boosting operation. First, when the low-arm switching element 38 of the VCU 30 is turned on, energy is accumulated in the reactor L due to a current I1 supplied from the low-voltage external charger CL, and a current flows from the smoothing capacitor C2 to the high-voltage battery BH. Thereafter, when the low-arm switching element 38 is turned off, energy accumulated in the reactor L flows as a discharge current I2 to the high-voltage battery BH via the diode 37 and energy is accumulated in the smoothing capacitor C2. At the time of the boosting operation, a current is supplied from the low-voltage external charger CL to the high-voltage battery BH by turning on and off the low-arm switching element 38 at a predetermined cycle according to the procedure described above. Further, at the time of this boosting operation, the high-arm switching element 36 is turned on and off at a predetermined cycle or left off.

During quick charging, the vehicle auxiliary device 22 is electrically disconnected from the low-voltage external charger CL because the contactor 2 is open, and the output voltage of the low-voltage external charger CL is not applied to the vehicle auxiliary device 22. Therefore, it is unnecessary for the vehicle auxiliary device 22 to take into consideration the voltage applied from the low-voltage external charger CL. Therefore, it is possible to avoid an increase in the overall cost of the vehicle which occurs when the vehicle auxiliary device is configured to have a high operable voltage. Although the vehicle auxiliary device 22 is supplied with power from the low-voltage battery BL, since the operable voltage of the vehicle auxiliary device 22 is equal to or higher than a voltage of the fully charged low-voltage battery BL, there is no possibility that a life span or operation of the vehicle auxiliary device 22 will be adversely affected even when the voltage of the low-voltage battery BL is applied. The ECU 60 performs the quick charging described above in step S3 and proceeds to step S4.

In step S4, the ECU 60 determines whether or not the high-voltage battery BH is in a fully charged state. This determination is made by reading the detection signal bh of the sensor unit SH, calculating the SOC of the high-voltage battery BH, and checking whether or not the SOC is at a fully charged level. When the determination in step S4 is NO, the flow proceeds to step S5, and when the determination in step S4 is YES, the quick charge processing ends.

On the other hand, in a state in which the contactor 3 is closed, since power is continuously supplied from the low-voltage battery BL to the vehicle auxiliary device 22, the SOC of the low-voltage battery BL gradually decreases. In step S5, the ECU 60 determines whether or not the voltage of the low-voltage battery BL acquired on the basis of the detection signal b1 from the sensor unit SL is lower than the first switching voltage b [V] which is defined to be lower than the operable voltage of the vehicle auxiliary device 22. The determination in step S5 is a determination as to whether or not a power storage amount of the low-voltage battery BL has decreased to such an extent as to require charging, and when this determination is YES, the flow proceeds to step S6, and when the determination is NO, the flow proceeds to step S3. That is, charging of the high-voltage battery BH is continued unless the voltage of the low-voltage battery BL is lower than the first switching voltage b [V].

Further, the voltage of the low-voltage battery BL has a positive correlation with its SOC. That is, the higher the voltage, the higher the SOC. Therefore, in step S5, instead of comparing the voltage of the low-voltage battery BL with the switching voltage b [V], the same effect is achieved by comparing the SOC of the low-voltage battery BL acquired on the basis of the detection signal b1 from the sensor unit SL with a predetermined first switching charge rate a [%].

In step S6, the ECU 60 sends the above-described charger control signal to the low-voltage external charger CL to stop the low-voltage external charger CL and also supplies the control signal P11 to the contactor 2. As a result, the contactor 2 is closed. In addition, a current path is established from the high-voltage battery BH to supply a voltage stepped down via the VCU 30 to the low-voltage battery BL and the vehicle auxiliary device 22. The current path from the high-voltage battery BH to the low-voltage battery BL is as follows when it is traced along a path on the positive electrode side. High-voltage battery BH→contactor 11→positive line PLH of high-voltage circuit 10→VCU 30→positive line PLL of low-voltage circuit 20→contactor 3→positive electrode of low-voltage battery BL. On the other hand, since the contactor 2 is closed by the control signal P11, the vehicle auxiliary device 22 is electrically connected between the lines of the low-voltage circuit 20 (between the positive line PLL and the negative line NLL). After the processing of step S6, the ECU 60 proceeds to step S7.

In step S7, the ECU 60 causes the gate drive circuit 50 to supply a drive signal to the VCU 30. Thereby, the VCU 30 performs a voltage step-down operation, and the low-voltage battery BL is charged with power of the high-voltage battery BH.

Figure 4:
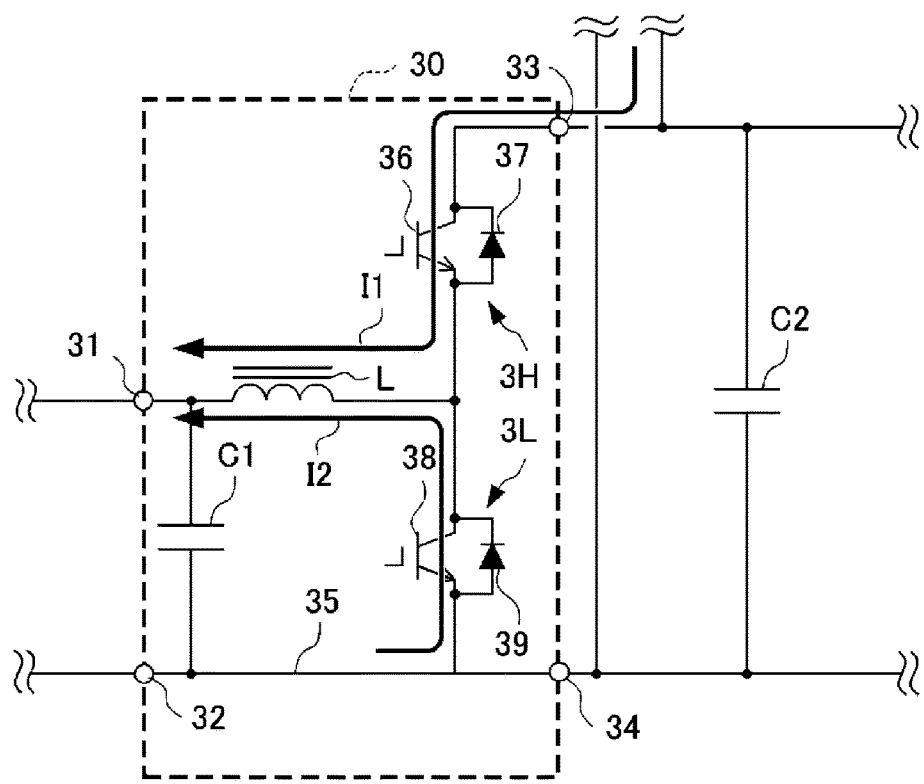
FIG. 4 is a circuit diagram for describing a flow of current at the time of a voltage step-down operation.

FIG. 4 is a diagram for describing a flow of current at the time of a voltage step-down operation. First, when the high-arm switching element 36 of the VCU 30 is turned on, the current I1 supplied from the high-voltage external charger CH flows through the high-arm switching element 36, and causes the reactor L and the smoothing capacitor C1 to accumulate energy and the vehicle auxiliary device 22 to be driven. Thereafter, when the high-arm switching element 36 is turned off, the energy accumulated in the reactor L is supplied as the discharge current I2 to the vehicle auxiliary device 22, and electric charge accumulated in the smoothing capacitor C1 is also supplied to the vehicle auxiliary device 22. At the time of the voltage step-down operation, a current is supplied from the high-voltage external charger CH to the vehicle auxiliary device 22 by turning on and off the high-arm switching element 36 at a predetermined cycle according to the procedure as described above. Further, at the time of this voltage step-down operation, the low-arm switching element 38 is turned on and off at a predetermined cycle or left off.

On the other hand, similarly to the low-voltage battery BL, power is supplied from the high-voltage battery BH also to the vehicle auxiliary device 22 connected between the lines of the low-voltage circuit 20. When the VCU 30 is driven to perform the voltage step-down operation described above, a voltage on the low-voltage side of the VCU 30 is controlled to be equal to or lower than the operable voltage of the vehicle auxiliary device 22. Therefore, a voltage exceeding the operable voltage is prevented from being applied to the vehicle auxiliary device 22. After the processing of step S7, the ECU 60 proceeds to step S8.

In step S8, the ECU 60 determines whether or not the voltage of the low-voltage battery BL acquired on the basis of the detection signal b1 from the sensor unit SL is higher than a second switching voltage d [V] which is defined to be higher than the first switching voltage b [V]. The determination in step S8 is a determination as to whether or not the power storage amount of the low-voltage battery BL has recovered to such an extent as to not require charging, and when this determination is YES, the flow proceeds to step S2, and when the determination is NO, charging to the high-voltage battery BH is resumed. When the determination is NO, the flow proceeds to step S7. That is, the above-described step S7 is maintained until the determination in step S8 becomes YES.

In the determination of step S8, as in the determination of step S5 described above, instead of comparing the voltage of the low-voltage battery BL with the second switching voltage d [V], the same effect is achieved by comparing the SOC of the low-voltage battery BL acquired on the basis of the detection signal b1 from the sensor unit SL with a predetermined second switching charge rate c [%].

On the other hand, when NO is determined in step S1 described above, a charger connected to the power supply device 1 of the vehicle is not the low-voltage external charger CL. That is, the charger connected to the power supply device 1 of the vehicle is the high-voltage external charger CH, and in this case, the flow proceeds to step S9 as described above.

In step S9, the ECU 60 executes processing of closing the contactor 3 by the control signal P12 and closing the contactor 2 by the control signal P11. When both the contactor 3 and the contactor 2 are closed, the output voltage of the high-voltage external charger CH is applied to the high-voltage battery BH and the high-voltage battery BH is in a state in which it can be charged. In addition, the high-voltage battery BH is in a state in which it can be charged, and a current path from the high-voltage external charger CH to the low-voltage battery BL and the vehicle auxiliary device 22 is established. The current path in this case is the same as the current path from the high-voltage battery BH to the low-voltage battery BL and the vehicle auxiliary device 22 established in step S6 described above. After the processing of step S9, the ECU 60 proceeds to step S10.

In step S10, the ECU 60 causes the gate drive circuit 50 to supply a drive signal to the VCU 30. Thereby, the VCU 30 performs the voltage step-down operation. Therefore, the voltage stepped down by the VCU 30 is supplied to the low-voltage battery BL and the vehicle auxiliary device 22, and thus charging of the low-voltage battery BL and power supply to the vehicle auxiliary device 22 are performed. In addition, while the voltage step-down operation is executed in the VCU 30, a current is supplied from the high-voltage external charger CH via the VCU 30 to the low-voltage battery BL and the vehicle auxiliary device 22 and the high-voltage battery BL is directly supplied with the current from the high-voltage external charger CH and charged. After the processing of step S10, the ECU 60 proceeds to step S11.

In step S11, the ECU 60 determines whether or not the high-voltage battery BH is in a fully charged state. This determination is made by reading the detection signal bh of the sensor unit SH, calculating the SOC of the high-voltage battery BH, and checking whether or not the SOC is at a fully charged level. When the determination in step S11 is NO, the flow proceeds to step S10 to continue charging, and when the determination in step S11 is YES, the quick charge processing ends.

Second Embodiment

Next, a second embodiment of the disclosure will be described with reference to the drawings.

Figure 5:
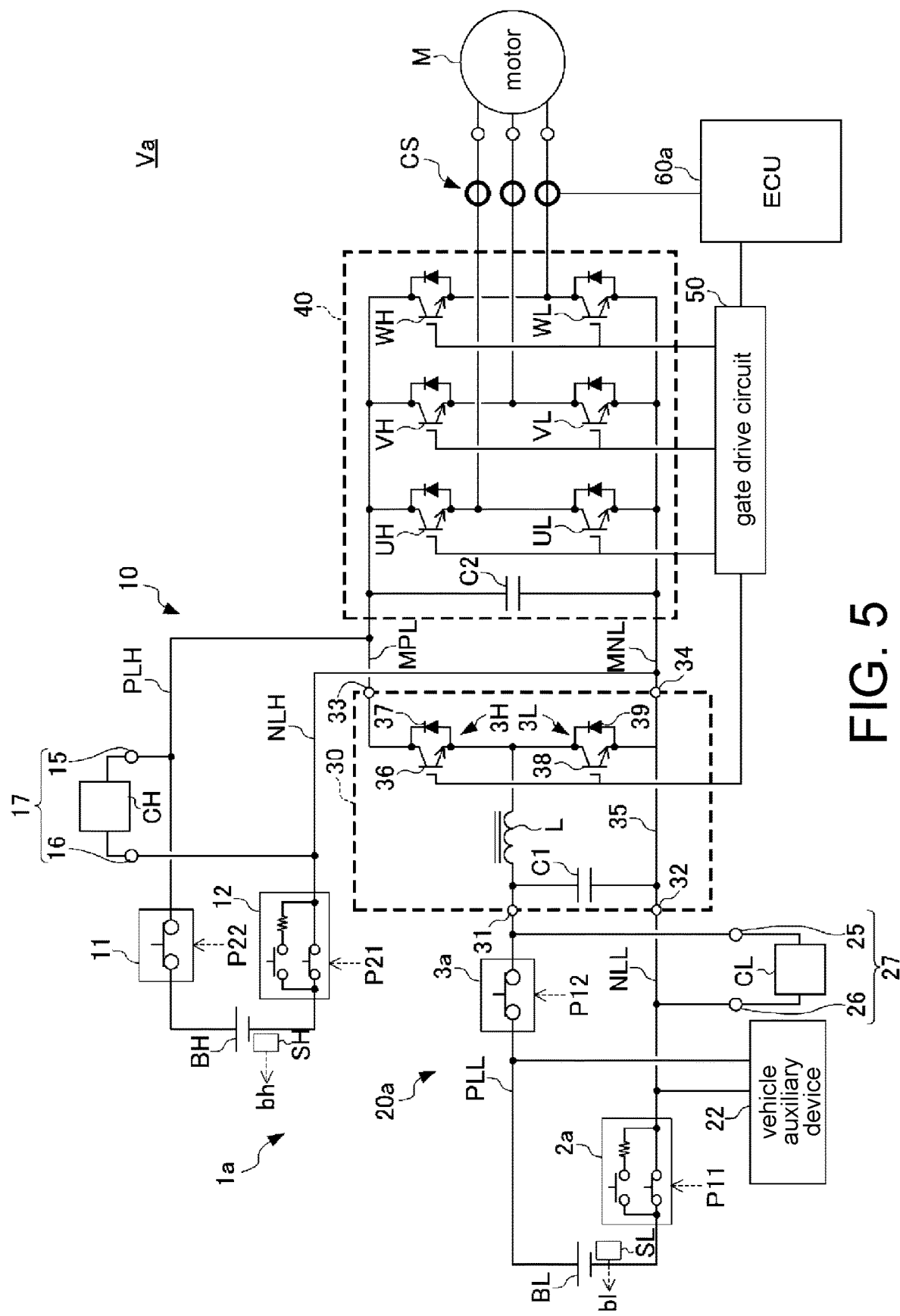
FIG. 5 is a diagram illustrating a configuration of an electric vehicle on which a power supply device according to a second embodiment of the disclosure is mounted and two types of external chargers.

FIG. 5 is a diagram illustrating a configuration of a vehicle Va on which a power supply device 1a according to the present embodiment is mounted and two types of external chargers CH and CL for the vehicle Va. In FIG. 5, parts corresponding to those in FIG. 1 are denoted by the same reference signs, and the description of those corresponding parts of FIG. 1 is cited herein.

Differences from the power supply device 1 of the vehicle in FIG. 1 in the power supply device 1a of the vehicle in FIG. 5 are as follows. That is, in the power supply device 1 of the vehicle V in FIG. 1, the switch for electrically opening and closing between the vehicle auxiliary device 22 and the low-voltage external terminal 27 is the negative contactor 2. The negative contactor 2 is interposed between respective connection points of the low-voltage external negative terminal 26 and the vehicle auxiliary device 22 in the negative line NLL. In contrast, in the power supply device 1a of the vehicle in FIG. 5, a switch for electrically opening and closing between a vehicle auxiliary device 22 and a low-voltage external terminal 27 is a positive contactor 3a. The positive contactor 3a is interposed in a positive line PLL. Specifically, the positive contactor 3a is interposed between respective connection points of a low-voltage external positive terminal 25 of the low-voltage external terminal 27 and a positive electrode side of the vehicle auxiliary device 22 in the positive line PLL. Further, in the power supply device 1 of the vehicle in FIG. 1, connection and disconnection between the positive electrode side of the low-voltage battery BL and the low-voltage circuit 20 are performed by the positive contactor 3. In contrast, in the power supply device 1a of the vehicle shown in FIG. 5, connection and disconnection between a negative electrode side of a low-voltage battery BL and a low-voltage circuit 20a are performed by a negative contactor 2a. The negative contactor 2a is provided on the low-voltage battery BL side with respect to a connection point of the vehicle auxiliary device 22 in a negative line NLL.

As is apparent from the above-described differences between FIG. 1 and FIG. 5, a processing procedure executed by an ECU 60a as a control portion at the time of quick charging in the power supply device 1a of the vehicle in FIG. 5 is equivalent to one in which the negative contactor 2 in the flowchart of FIG. 2 is replaced with the positive contactor 3a and the positive contactor 3 is replaced with the negative contactor 2a. Therefore, for the processing procedure executed by the control portion at the time of quick charging in the power supply device 1a of the vehicle in FIG. 5, description according to the flowchart of FIG. 2 is cited herein with appropriate replacements.

Also in the power supply device 1a of the vehicle in FIG. 5, during quick charging, the vehicle auxiliary device 22 is electrically disconnected from a low-voltage external charger CL due to the contactor 3a being opened, and an output voltage of the low-voltage external charger CL is not applied to the vehicle auxiliary device 22. Therefore, it is essentially unnecessary for the vehicle auxiliary device 22 to take into consideration the voltage applied from the low-voltage external charger CL. In addition, since an operable voltage of the vehicle auxiliary device 22 is equal to or higher than a voltage of the low-voltage battery BL, even when the voltage of the low-voltage battery BL is applied, there is no possibility that a life span or operation will be adversely affected.

Also, when it is determined that an SOC of the low-voltage battery BL has decreased, the low-voltage battery BL can be charged from the high-voltage battery BH and power can be supplied to the vehicle auxiliary device 22 via the closed contactor 3a.

Although embodiments of the disclosure have been described above, the disclosure is not limited thereto. Detailed configurations may be appropriately changed within the scope of the gist of the disclosure.

For example, semiconductor switching elements may be used in place of the contactors 2, 3, 2a, 3a, 11 and 12 in both the first embodiment and the second embodiment.

When the voltage of the low-voltage battery BL is lower than the first switching voltage b [V] while the high-voltage battery BH is being charged from the low-voltage external charger CL (or when the SOC of the low-voltage battery BL is lower than the first switching charge rate a [%]) as described above, control may be performed such that the contactor 2 is closed to supply power to the vehicle auxiliary device 22 in a state in which the output voltage of the low-voltage external charger CL is lowered to be equal to or lower than the operable voltage of the vehicle auxiliary device 22 while also charging the low-voltage battery BL from the low-voltage external charger CL.

According to an embodiment of the disclosure, when the second capacitor is charged with the external charger, the switch is opened to cut off supply of a current from the external charger to the vehicle auxiliary device, and a current is supplied from the first capacitor to the vehicle auxiliary device.

According to an embodiment of the disclosure, an operable voltage of the vehicle auxiliary device is equal to or lower than a charging voltage of the external charger.

According to an embodiment of the disclosure, the power supply device further includes a charging parameter acquisition portion (for example, a sensor unit SL to be described below) which acquires a value of a charging parameter correlated with a power storage amount of the first capacitor, and a control portion (for example, an electronic control unit (ECU) 60 or 60a to be described below) which stops charging by the external charger and closes the switch to cause a current to be supplied from the second capacitor to the first capacitor when the value of the charging parameter is lower than a switching threshold value at the time of charging the second capacitor by the external charger.

According to an embodiment of the disclosure, the power supply device further includes a charging parameter acquisition portion (for example, a sensor unit SL to be described below) which acquires a value of a charging parameter correlated with a power storage amount of the first capacitor; and a control portion (for example, an ECU 60 or 60a to be described below) which decreases the charging voltage of the external charger to the operable voltage or lower and closes the switch to cause a current to be supplied from the external charger to the vehicle auxiliary device and the first capacitor when the value of the charging parameter is lower than a switching threshold value at the time of charging the second capacitor by the external charger.

According to an embodiment of the disclosure, an operable voltage of the vehicle auxiliary device may be equal to or lower than a charging voltage of the external charger and equal to or higher than a predetermined switching voltage (for example, a first switching voltage b [V] to be described below), and the power supply device further includes a control portion which stops charging by the external charger and closes the switch to cause a current to be supplied from the second capacitor to the first capacitor when a voltage of the first capacitor is lower than the switching voltage at the time of charging the second capacitor by the external charger.

According to an embodiment of the disclosure, an operable voltage of the vehicle auxiliary device may be equal to or lower than a charging voltage of the external charger and equal to or higher than a predetermined switching voltage (for example, a first switching voltage b [V] to be described below), and the power supply device further includes a control portion which decreases the charging voltage of the external charger to be equal to or lower than the operable voltage and closes the switch to cause a current to be supplied from the external charger to the vehicle auxiliary device and the first capacitor when a voltage of the first capacitor is lower than the switching voltage at the time of charging the second capacitor by the external charger.

(1) In the power supply device of the disclosure, the external connecting portion to which the external charger is connected is provided between the first capacitor and the voltage converter in the first circuit in which the first capacitor is provided, and the switch for electrically opening and closing between the vehicle auxiliary device and the external connecting portion is further provided. In this power supply device, when the switch is opened, the vehicle auxiliary device is electrically disconnected from the external charger. Therefore, when the external charger is operating at a high output voltage exceeding the operable voltage of the vehicle auxiliary device, if the switch is open, no high voltage is applied to the vehicle auxiliary device. Thus, it is possible to allow capability of the external charger to be sufficiently exhibited without causing the vehicle auxiliary device to have a high operable voltage.

(2) In the disclosure, when the second capacitor is charged with the external charger, the switch is opened to cut off supply of a current from the external charger to the vehicle auxiliary device, and a current is supplied from the first capacitor to the vehicle auxiliary device. This allows the external charger to sufficiently exhibit its capability without being restricted by the operable voltage of the vehicle auxiliary device and perform charging of the second capacitor while simultaneously continuing to drive the vehicle auxiliary device using power of the first capacitor. Further, in the disclosure, since a current is supplied from the first capacitor having a low output voltage to the vehicle auxiliary device, the operable voltage necessary for the vehicle auxiliary device may be low. Therefore, an increase in the overall cost of the vehicle and an increase in loss that may occur when the vehicle auxiliary device is configured to have a high operable voltage can be avoided.

(3) In the disclosure, the operable voltage of the vehicle auxiliary device is equal to or lower than a charging voltage of the external charger. Thereby, it is possible to prevent a voltage exceeding the operable voltage from being applied to the vehicle auxiliary device from the external charger using the switch while suppressing the increase in the overall cost of the vehicle.

(4) As described above, in the power supply device of the disclosure, power is supplied from the first capacitor to the vehicle auxiliary device during external charging by the external charger, and thus a value of a charging parameter such as a voltage or SOC correlated with a power storage amount of the first capacitor may decrease during the external charging. In the power supply device of the disclosure, when the value of the charging parameter of the first capacitor is lower than a switching threshold value at the time of charging the second capacitor by the external charger, the charging by the external charger is stopped and a current is supplied from the second capacitor to the first capacitor. Thus, even when the value of the charging parameter of the first capacitor decreases, the first capacitor can be recharged. Therefore, it is possible to sufficiently charge both the first capacitor and the second capacitor.

(5) In the power supply device of the disclosure, when the value of the charging parameter is lower than the switching threshold value at the time of charging the second capacitor by the external charger, the charging voltage of the external charger is decreased to be equal to or lower than the operable voltage of the vehicle auxiliary device, the switch is closed, and a current is supplied from the external charger to the vehicle auxiliary device and the first capacitor. Thus, even when the value of the charging parameter of the first capacitor decreases, the first capacitor can be recharged. Therefore, it is possible to sufficiently charge both the first capacitor and the second capacitor.

(6) In the power supply device of the disclosure, the operable voltage of the vehicle auxiliary device is equal to or lower than a charging voltage of the external charger and equal to or higher than a switching voltage. In the power supply device of the disclosure, when a voltage of the first capacitor is lower than the predetermined switching voltage at the time of charging the second capacitor by the external charger, the switch is closed, and a current is supplied from the second capacitor to the first capacitor. In other words, in the power supply device of the disclosure, the switch is closed only after the voltage of the first capacitor is decreased to the switching voltage determined to be lower than the operable voltage of the vehicle auxiliary device. Thereby, it is possible to adjust the charging voltage from the second capacitor side with the operable voltage as the upper limit, apply a voltage of an appropriate magnitude to the vehicle auxiliary device, and simultaneously supply a current to the first capacitor and charge it.

(7) In the power supply device of the disclosure, the operable voltage of the vehicle auxiliary device is equal to or lower than a charging voltage of the external charger and equal to or higher than a switching voltage. Also, in the power supply device of the disclosure, when a voltage of the first capacitor is lower than the predetermined switching voltage at the time of charging the second capacitor by the external charger, the switch is closed and a current is supplied from the external charger in which charging voltage has been lowered to the first capacitor. In other words, in the power supply device of the disclosure, the switch is closed only after the voltage of the first capacitor is decreased to the switching voltage determined to be lower than the operable voltage of the vehicle auxiliary device. Thereby, it is possible to adjust the charging voltage from the external charger with the operable voltage as the upper limit, apply a voltage of an appropriate magnitude to the vehicle auxiliary device, and simultaneously supply a current to the first capacitor and charge it.

It will be apparent to those skilled in the art that various modifications and variations can be made to the disclosed embodiments without departing from the scope or spirit of the disclosure. In diagram of the foregoing, the disclosure is intended to cover modifications and variations provided that they fall within the scope of the following claims and their equivalents.

What is claimed is:

1. A power supply device of a vehicle comprising:
a first circuit in which a first battery is provided;
a second circuit in which a second battery having a full charge voltage higher than that of the first battery is provided;
a voltage converter provided between the first circuit and the second circuit; and
a first external connecting portion provided between the first battery and the voltage converter in the first circuit; and
a second external connecting portion provided between the second battery and the voltage converter in the second circuit, wherein:
a vehicle auxiliary device is connected to the first circuit, the power supply device of the vehicle further comprises a switch electrically opening and closing between the vehicle auxiliary device and the first external connecting portion,
when the second battery is charged from the first external connecting portion with a first external charger, the switch is opened to cut off supply of a current from the first external charger to the vehicle auxiliary device, and a current is supplied from the first battery to the vehicle auxiliary device,
when the first battery and the second battery are charged from the second external connecting portion with a second external charger, the switch is closed.

2. The power supply device of the vehicle according to claim 1, wherein an operable voltage of the vehicle auxiliary device is equal to or lower than a charging voltage of the first external charger.

3. The power supply device of the vehicle according to claim 2, further comprising:
a charging parameter acquisition portion which acquires a value of a charging parameter correlated with a power storage amount of the first battery; and
a control portion which stops charging by the first external charger and closes the switch to cause a current to be supplied from the second battery to the first battery when the value of the charging parameter is lower than a switching threshold value at the time of charging the second battery by the first external charger.

4. The power supply device of the vehicle according to claim 2, further comprising:
a charging parameter acquisition portion which acquires a value of a charging parameter correlated with a power storage amount of the first battery; and
a control portion which decreases the charging voltage of the first external charger to the operable voltage or lower and closes the switch to cause a current to be supplied from the first external charger to the vehicle auxiliary device and the first battery when the value of the charging parameter is lower than a switching threshold value at the time of charging the second battery by the first external charger.

5. The power supply device of the vehicle according to claim 1, wherein an operable voltage of the vehicle auxiliary device is equal to or lower than a charging voltage of the first external charger and equal to or higher than a predetermined switching voltage,
the power supply device further comprising:
a control portion which stops charging by the first external charger and closes the switch to cause a current to be supplied from the second battery to the first battery when a voltage of the first battery is lower than the switching voltage at the time of charging the second battery by the first external charger.

6. The power supply device of the vehicle according to claim 1, wherein an operable voltage of the vehicle auxiliary device is equal to or lower than a charging voltage of the first external charger and equal to or higher than a predetermined switching voltage,
the power supply device further comprising:
a control portion which decreases the charging voltage of the first external charger to be equal to or lower than the operable voltage and closes the switch to cause a current to be supplied from the first external charger to the vehicle auxiliary device and the first battery when a voltage of the first battery is lower than the switching voltage at the time of charging the second battery by the first external charger.

7. The power supply device of the vehicle according to claim 1, wherein an operable voltage of the vehicle auxiliary device is equal to or lower than a charging voltage of the first external charger.

8. The power supply device of the vehicle according to claim 1, wherein an operable voltage of the vehicle auxiliary device is equal to or lower than a charging voltage of the first external charger and equal to or higher than a predetermined switching voltage,
the power supply device further comprising:
a control portion which stops charging by the first external charger and closes the switch to cause a current to be supplied from the second battery to the first battery when a voltage of the first battery is lower than the switching voltage at the time of charging the second battery by the first external charger.

9. The power supply device of the vehicle according to claim 1, wherein an operable voltage of the vehicle auxiliary device is equal to or lower than a charging voltage of the first external charger and equal to or higher than a predetermined switching voltage,
the power supply device further comprising:
a control portion which decreases the charging voltage of the first external charger to be equal to or lower than the operable voltage and closes the switch to cause a current to be supplied from the first external charger to the vehicle auxiliary device and the first battery when a voltage of the first battery is lower than the switching voltage at the time of charging the second battery by the first external charger.

\* \* \* \* \*